(12) United States Patent
Wei et al.

(10) Patent No.: US 11,791,749 B2
(45) Date of Patent: Oct. 17, 2023

(54) SELF-POWERING WIRELESS DEVICE AND METHOD

(71) Applicant: CASE WESTERN RESERVE UNIVERSITY, Cleveland, OH (US)

(72) Inventors: Ran Wei, Shaker Heights, OH (US); Philip Feng, Beachwood, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 481 days.

(21) Appl. No.: 16/809,321

(22) Filed: Mar. 4, 2020

(65) Prior Publication Data
US 2020/0287479 A1 Sep. 10, 2020

Related U.S. Application Data

(60) Provisional application No. 62/814,191, filed on Mar. 5, 2019.

(51) Int. Cl.
| | |
|---|---|
| *H02N 2/18* | (2006.01) |
| *H10N 30/30* | (2023.01) |
| *H10N 30/80* | (2023.01) |
| *H10N 30/853* | (2023.01) |

(52) U.S. Cl.
CPC ............. *H02N 2/188* (2013.01); *H02N 2/18* (2013.01); *H10N 30/306* (2023.02); *H10N 30/802* (2023.02); *H10N 30/8548* (2023.02)

(58) Field of Classification Search
CPC ...... H02N 2/18; H02N 2/188; H01L 41/1136; H01L 41/1875; H01L 41/042
See application file for complete search history.

(56) References Cited

U.S. PATENT DOCUMENTS

| | | | |
|---|---|---|---|
| 2010/0176694 A1* | 7/2010 | Eckstein | H02N 2/188 310/339 |
| 2016/0233413 A1* | 8/2016 | Zawada | H01L 41/053 |
| 2019/0020290 A1* | 1/2019 | Feng | H02N 2/188 |

OTHER PUBLICATIONS

Luis Ruiz-Garcia, et al.; "A Review of Wireless Sensor Technologies and Applications in Agriculture and Food Industry: State of the Art and Current Trends"; Open Access Sensors ISSN 1424-8220 www.mdpi.com/journal/sensors; Jun. 16, 2009; 23 pgs.

I. F. Akyildiz, et al.; "Wireless sensor networks: a survey"; Computer Networks 38 (2002) 393-422, www.elsevier.com/locate/comnet; Dec. 20, 2001; 30 pgs.

Jerome P. Lynch, et al. "A Summary Review of Wireless Sensors and sensor Networks for Structural Health Monitoring"; Articles; The Shock and Vibration Digest, vol. 38, No. 2, Mar. 2006 91-128; http://svd.sagepub.com; Apr. 17, 2008; 39 pgs.

(Continued)

*Primary Examiner* — J. San Martin
(74) *Attorney, Agent, or Firm* — TAROLLI, SUNDHEIM, COVELL & TUMMINO, LLP

(57) ABSTRACT

In an example, an energy harvesting system includes a support apparatus and a piezoelectric element. The piezoelectric element may be configured as a plate supported at its periphery by the support apparatus to enable a central portion of the piezoelectric element to move along an axis that is orthogonal to a contact surface of the plate. A body having a mass is configured to move in a direction that is substantially parallel to the axis of the plate and apply force to deform the contact surface of the plate, such that electrical energy is generated by the piezoelectric element based on the applied force.

16 Claims, 5 Drawing Sheets

(56) References Cited

OTHER PUBLICATIONS

Andrew Dursch, et al.; "Bluetooth Technology: An Exploratory Study of the Analysis and Implementation Frameworks"; www.ElsevierComputerScience.com; Computer Standards & Interfaces 26 (2004) 263-277; Dec. 20, 2003; 15 pgs.

Paolo Baronti, et al.; "Wireless sensor networks: A survey on the state of the art and the 802.15.4 and ZigBee standards"; www.sciencedirect.com ScienceDirect Computer Communications 30 (2007) 1655-1695; Dec. 29, 2006; 41 pgs.

Z.G. Wan, et al., "Review on Energy Harvesting and Energy Management for Sustainable Wireless Sensor Networks"; IEEE Xplore; Feb. 27, 2012; 6 pgs.

R. Banos, et al.; "Optimization methods applied to renewable and sustainable energy: A review"; ScienceDirect www.elsevier.com/locate/rser; Dec. 27, 2010; 14 pgs.

Xiaofan Jiang, et al.; "Perpetual Environmentally Powered Sensor Networks"; IEEE; Computer Science; May 23, 2017; 6 pgs.

R. L. Harne, et al.; "A review of the recent research on vibration energy harvesting via bistable systems"; IOP Publishing Smart Materials and Structures 22 (2013) 023001, Topica Review; stacks.iop.org/SMS/22/023001; Jan. 25, 2013; 13 pgs.

Heung Soo Kim, et al.; "A Review of Piezoelectric Energy Harvesting Based on Vibration"; International Journal of Precision Engineering and Manufacturing vol. 12, No. 6, pp. 1129-1141; Dec. 2011; 13 pgs.

Salem Saadon, et al.; "A review of vibration-based MEMS piezoelectric energy harvesters"; ScienceDirect; www.elsevier.com/locate/enconman; Jul. 14, 2010; 5 pgs.

Yen Kheng Tan, et al.; "Energy Harvesting From Hybrid Indoor Ambient Light and Thermal Energy Sources for Enhanced Performance of Wireless Sensor Nodes"; IEEE Transactions on Industrial Electronics, vol. 58, No. 9, Aug. 12, 2011; 12 pgs.

S. B. Horowitz, et al.; "A MEMS acoustic energy harvester"; 2006 J. Micromech Microeng. 16 S174; Aug. 9, 2006; 9 pgs.

Robert Myers, et al.; "Small scale windmill"; American Institute of Physics; Applied Physics Letters 90, 054106 (2007); doi: 10.1063/1.2435346; Dec. 27, 2006; 4 pgs.

EIA—Independent Statistics & Analysis U.S. Energy Information Administration; Electric Power Monthly with Data for Jun. 2018; Aug. 2018; 256 pgs.

Amit Lal, et al.; "Pervasive Power: A Radioisotope-Powered Piezoelectric Generator"; Cornell University—Energy Harvesting & Conservation; Published by IEEE CS and IEEE ComSoc; Jan.-Mar. 2005; 9 pgs.

Ran Wei, et al., "Characterizing Piezoelectric Cantilevers for Vibration Energy Harvesting under Ambient Conditions"; IEEE Xplore; Oct. 24, 2013.

M. Amin Karami, et al., "Electromechanical Modeling of the Low-Frequency Zigzag Micro-Energy Harvester"; Journal of Intelligent Material Systems and Structures, vol. 22; Feb. 2011; 12 pgs.

J. Ajitsaria, et al; "Modeling and analysis of a bimorph piezoelectric cantilever beam for voltage generation"; Smart Materials and Structures; Feb. 14, 2007; 9 pgs.

Jeong Woo, et al.; "Effect of length, width, and mode on the mass detection sensitivity of piezoelectric unimorph cantilevers"; AIP Journal of Applied Physics; Oct. 22, 2001; 8 pgs.

Guang Zhu, et al., "Flexible High-Output Nanogenerator Based on Lateral ZnO Nanowire Array"; Nano Letters; Sep. 20, 2018' 5 pgs.

R. Elfrink, et al..; "Vibration energy harvesting with aluminum nitride-based piezoelectric devices"; IOP Publishing—Journal of Miromechanics and Microengineering; Aug. 26, 2009; 9 pgs.

Mark Stewart, et al.; "Charge redistribution in piezoelectric energy harvesters"; American Institute of Physics—Applied Physical Letters 100; Jan. 21, 2012; 4 pgs.

7.4 the Elementary Beam Theory.

Chao Lu, et al.,; "Vibration Energy Scavenging SystemWith Maximum Power Tracking for Micropower Applications"; IEEE Transactions on very Large Scale Integration (VLSI) Systems, vol. 19, No. 11; Nov. 2011; 11 pgs.

Yogesh K. Ramadass, et al.,; "An Efficient Piezoelectric Energy Harvesting Interface Circuit Using a Bias-Flip Rectifier and Shared Inductor"; IEEE Journal of Solid-State Circuits, vol. 45, No. 1; Jan. 2010; 16 pgs.

Ethem Erkan Aktakka, et al..; "A Micro Inertial Energy Harvesting Platform With Self-Supplied Power Management Circuit for Autonomous Wireless Sensor Nodes"; IEEE Journal of Solid-State Circuits, vol. 49, No. 9; Sep. 2014; 13 pgs.

Shiquan Fan, et al.,; "An Ultralow Quiescent Current Power Management System With Maximum Power Point Tracking (MPPT) for Batteryless Wireless Sensor Applications"; IEEE Transactions on Power Electronics, vol. 33, No. Sep. 9, 2018; 12 pgs.

Bruel & Kjaer; "Measuring Vibration"; 42 pgs.

Shuo Cheng, et al.,; "An Active Voltage Doubling AC/DC Converter for Low-Voltage Energy Harvesting Applications"; IEEE Transactions on Power Electronics, vol. 26, No. 8; Aug. 2011; 98 pgs.

E. Minazara, et al.,; "Piezoelectric diaphragm for vibration energy harvesting"; ScienceDirect; www.elsevier.com/locate/ultras; Jun. 9, 2006; 5 pgs.

* cited by examiner

6A

6B

6C

SELF-POWERING WIRELESS DEVICE AND METHOD

CROSS-REFERENCE TO RELATED APPLICATION

This application claims the benefit of priority from U.S. Provisional Application No. 62/814,191 filed Mar. 5, 2019 and entitled SELF-POWERING WIRELESS DEVICE AND METHOD, which is incorporated herein by reference in its entirety.

TECHNICAL FIELD

This disclosure relates to self-powering wireless devices and related methods, including cold-start circuitry and methods for self-powering wireless devices.

BACKGROUND

Wireless sensors and sensor networks are promising for many applications, ranging from transforming ordinary buildings into smart buildings to monitoring multiple physical parameters at industrial plants and/or in challenging terrains and environments. These technologies have been attracting a tremendous amount of research effort due to the increasing growing and maturity of wireless standards, such as Bluetooth and ZigBee for the wireless sensor network. A central technical challenge confronting such sensors and sensor networks is that most, if not all of today's existing technologies rely on battery-powered devices. Battery replacement is inevitable on a yearly basis, if not quarterly or monthly, thus giving rise to excess field services and maintenance costs. This challenge is especially acute in a number of applications, where long-term, continuous (non-stop), and real-time sensing or monitoring are needed. In such cases, it is desirable to have self-powering sensor nodes that do not require batteries and only need minimal or zero maintenance beyond their installation.

SUMMARY

In an example, an energy harvesting system includes a support apparatus. A piezoelectric element is configured as a plate supported at its periphery by the support apparatus to enable a central portion of the piezoelectric element to move along an axis that is orthogonal to a contact surface of the plate. A body having a mass is configured to move in a direction that is substantially parallel to the axis of the plate and apply force to deform the contact surface of the plate, such that electrical energy is generated by the piezoelectric element based on the applied force.

In another example, a self-powering wireless device includes an energy harvester module configured to convert ambient energy into an electrical signal. A wireless communication unit is configured to wirelessly transmit data within a wireless network. A power circuit includes a power converter circuit configured to convert the electrical signal to a supply voltage at an output thereof. The power circuit also includes an energy storage device coupled to the output of the power converter circuit to store electrical energy in response to the supply voltage. A battery monitor is configured to monitor the supply voltage, the battery monitor configured disable shutdown of a power management circuit during a start-up phase of the self-powering wireless device so as to provide sufficient time to allow the wireless communications unit to receive electrical power join a wireless network during the start-up phase.

DETAILED DESCRIPTION

This disclosure relates to self-powering wireless devices and related methods. More particularly, this disclosure relates to an energy harvesting apparatus and a wireless sensor node that includes such harvesting apparatus. This disclosure also relates to cold-start circuitry and methods for cold-starting self-powering wireless devices.

As disclosed herein, the approach disclosed herein may include individually or in combination (i) self-powering via vibration energy harvesting, (ii) high-efficiency power management circuit, and (iii) low power wireless communication.

As an example, sensor nodes use piezoelectric (PZE) material based mechanical resonators to harvest the vibrational energy of the equipment surfaces. Mechanical vibrations are prevalent in industrial buildings. The equipment, including motor and pump, remains on for hours or all day. Such vibration energy is usually wasted. The typical frequency range of industrial instruments is from 6 to 80 Hz, matching the resonance frequency mm- to cm-sized mechanical resonators.

As a further example, the amplitude of voltage generated from the PZE harvester depends on the intensity of the vibration source. However, to power an electronic device like sensors or a radio frequency (RF) transmitter, it needs a constant voltage, such as 3.3 V or 3 V. The power management circuit can convert the voltage from the PZE harvester and boost it to a fixed value, like 3.3 V, with high efficiency. The power management circuit further exhibits low power consumption, which conserves the energy harvested by the PZE for delivery to the functioning electronics.

As yet a further example, the sensor node also is configured to implement ultralow-power wireless communication, such as according to a ZigBee or other low power protocol. ZigBee protocol uses 2.4 GHz bandwidth and is effective for low power communication. The benefit of using existing communication protocol is the ease of establishing a wireless network and connecting to such network by the sensor node. Other protocols may be used in other examples.

Figure 1:
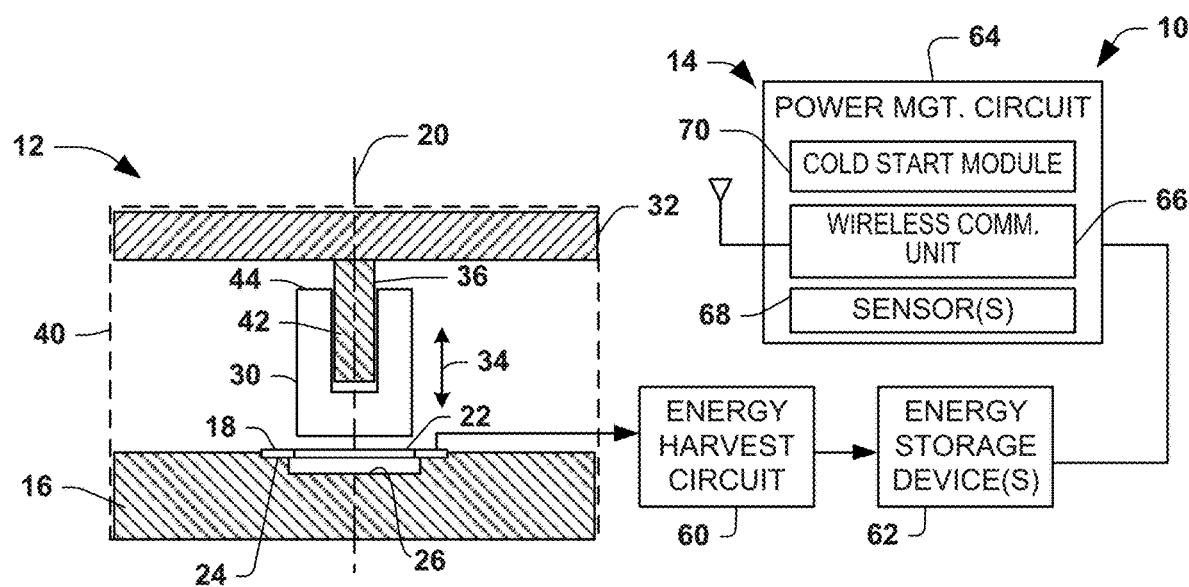
FIG. 1 depicts an example of an energy harvesting system implemented in conjunction with a self-powering wireless sensor.

FIG. 1 depicts an example of a self-powering wireless sensor system 10. The system 10 includes an energy harvesting apparatus that is configured to generate electrical energy that is provided to associated circuitry 14. Thus, the associated circuitry 14 is self-powered by electric energy produced by the energy harvesting apparatus 12.

Figure 2:
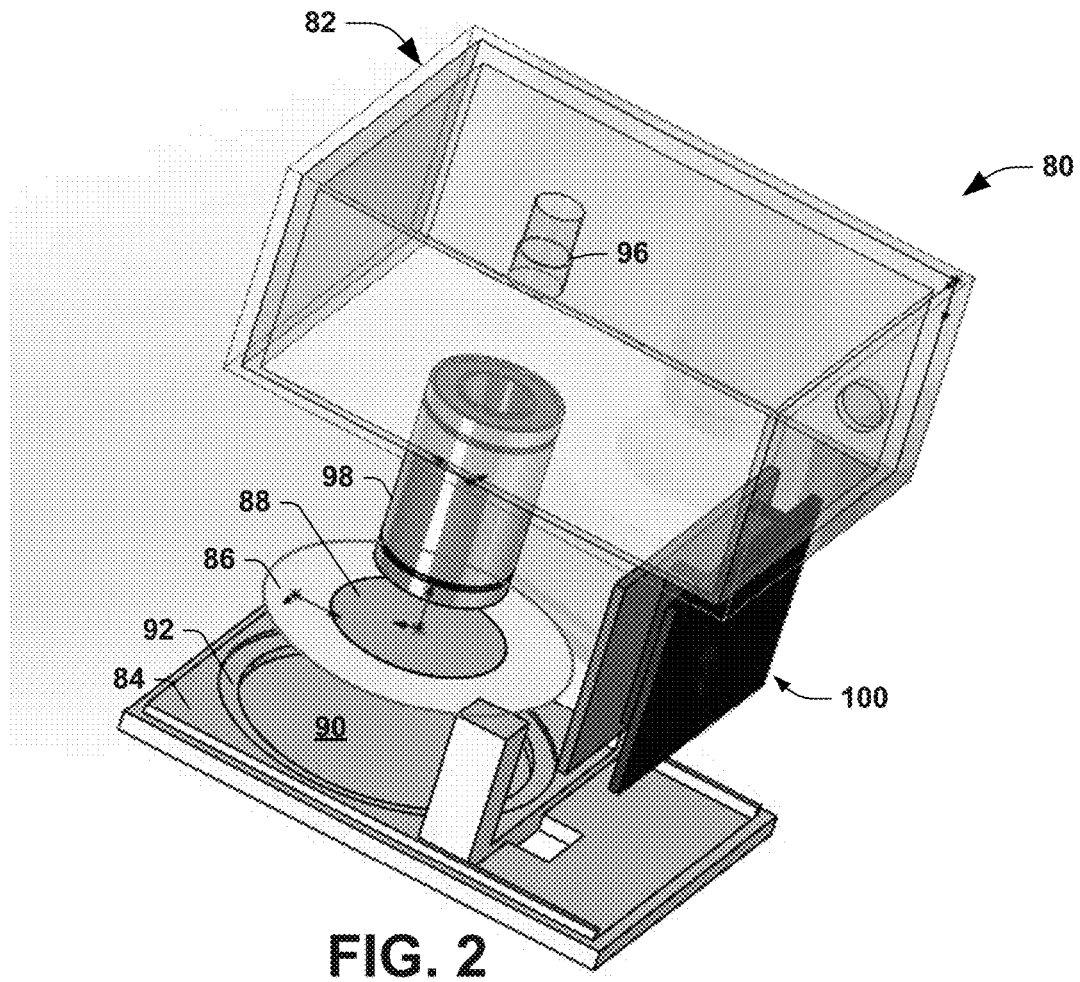
FIG. 2 depicts an example of an energy harvesting apparatus.
Figure 3:
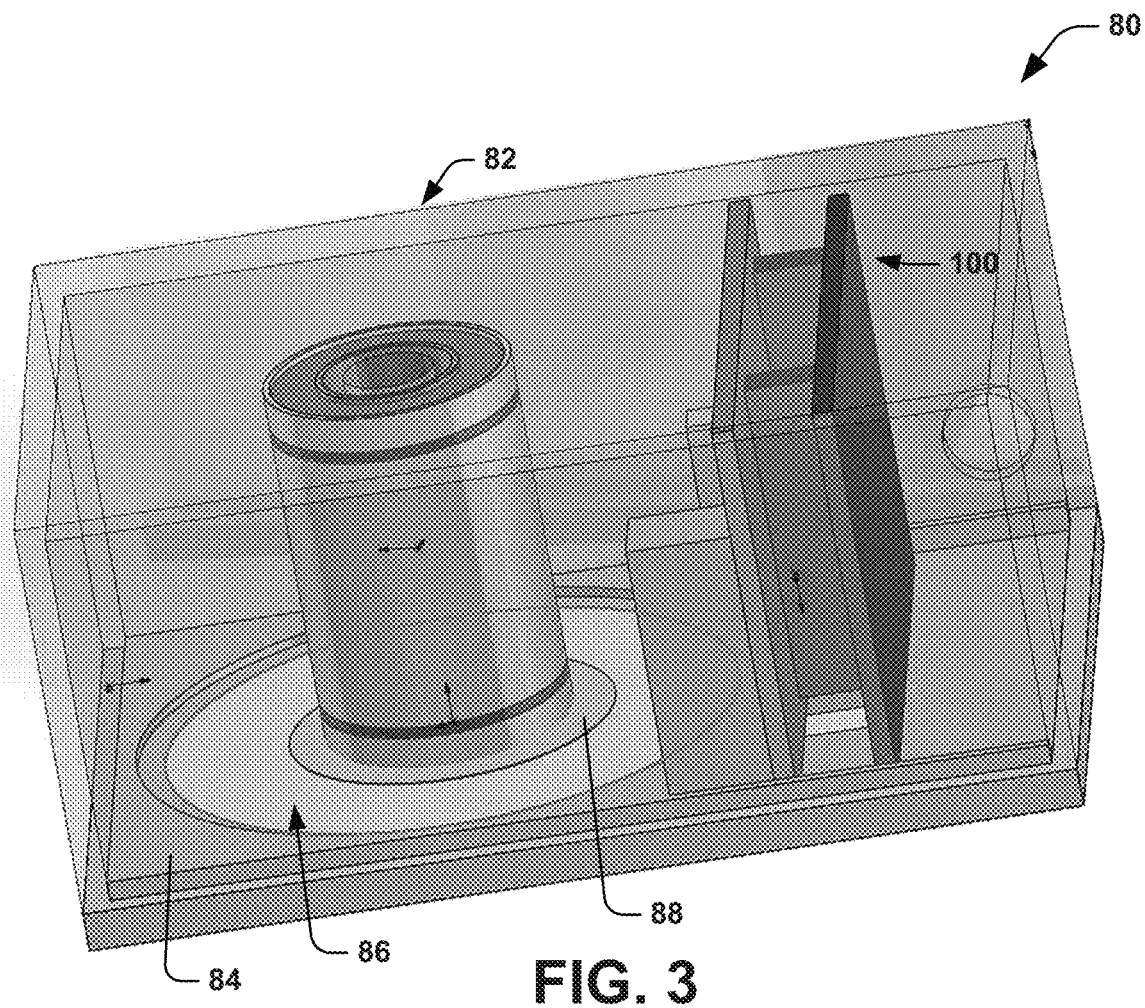
FIG. 3 depicts another view of the energy harvesting apparatus of FIG. 2.

In the example of FIG. 1 (as well as FIGS. 2 and 3). The energy harvesting apparatus 12 includes a support structure (e.g., frame) 16 that supports a piezoelectric element 18 along a periphery thereof. For example, the piezoelectric element is configured as a pliant plate of a piezoelectric material. The support 16 contacts a periphery of an orthogonal surface to enable a central portion of the piezoelectric element 18 to move with respect to the support generally along a central axis 20, which is orthogonal to a contact surface 22 of the piezoelectric element 18.

As an example, the piezoelectric element 18 includes a disc-shaped plate that includes the contact surface 22 and an opposing side surface 24. For example, the support apparatus 16 includes a recess extending from the support surface to provide a space (e.g., a void) in the support apparatus into which the central portion of the piezoelectric element can move. The spatial region of the recess also has a central axis that is aligned substantially coaxially with the axis 20. As an example, the piezoelectric element 18 can be a multi-layer structure such as including a layer of piezoelectric material (e.g., lead zirconate titanate (PZT)) that is mounted on a substrate material layer such as brass. Other piezoelectric materials may be used in other examples (e.g., $ZnO_2$, AlN, PDVF or the like). As used herein, the term "substantially" is used to indicate that some amount of variation (e.g., approximately +/−5% or less) from the intended relationship may occur, such as to allow some manufacturing tolerances or other deviation from the intended relationship.

The energy harvesting apparatus 12 also includes a body (e.g., a proof mass) 30 configured to move in a direction that is substantially parallel to the axis 20 and to contact the piezoelectric element 18 for harvesting vibration energy as electrical energy. The body 30 is configured to move in response to vibration of the harvesting apparatus 12. Movement of the body causes the body to apply force to the contact surface 22 of the piezoelectric element 18 to deform the plate, such that electrical energy is generated by the piezoelectric element based on the applied force (e.g., converting vibration energy to electrical energy). For example, the applied force results from vibration of the harvesting apparatus deforms and strains the piezoelectric element to generate the electrical energy.

A body support 32 is configured to constrain movement of the body 30 in the direction demonstrated at 34, which is substantially parallel to the axis 20. Each of the plate support 16 and the body support 32 can be fixed with respect to each other. For example, a housing, schematically demonstrated at 40, can include the plate support 16, the body support 32 as well as contain the piezoelectric element 18 and the body 30 within such housing. The body support 32 and plate support 16 further can be fixed with respect to the housing 40, such as forming or attached to opposing walls of the housing.

As shown in the examples of FIGS. 1-3, the body support 32 includes an elongated protrusion 36 that extends from an interior side of the body support 32. For example, the protruding support 36 extends coaxial with respect to the axis 20. The body 30 includes a central slot 42 extending from a proximal end 44 of the body into the body, and may extend completely through the body in some examples. The slot 42 is configured to slidably receive the protruding support 36 so as to constrain movement of the body 30 within the housing in the direction 34. For example, by mounting the housing 40 to a vibrating structure, such as a motor, generator or other plant equipment, the vibration of the structure to which the housing is attached are communicated through the housing to cause the body 30 to move along the support 36 in the direction 34 and repeatedly deform the piezoelectric element 18 over time and thereby generate electrical energy. As an example, housing 40 can be affixed to a vibrating structure by magnet adhesive or other means of attachment (e.g., weld, solder, straps, etc.).

The mass of the body 30 is configured to set a resonance frequency of the energy harvesting apparatus 12. For example, the mass is configured to provide a resonance frequency that is less than 120 hertz, such as ranging from about 30 to about 60 hertz, corresponding to the resonance vibrational frequency of the plant equipment to which the housing is attached. In an example, the housing 40 provides an enclosure and such enclosure includes means to access an interior of the housing, such as for accessing and replacing the body 30 with a different body 30 having a different mass. In this way, a body 30 can be selected from a plurality of different interchangeable bodies having different masses. Each mass thus can provide a different corresponding resonance frequency that can be matched to the equipment to which the housing is to be attached to increase energy harvesting capacity. This is in contrast to cantilever of other designs for energy harvesters that have fixed proof masses.

In the example of FIG. 1, the system 10 also includes an energy harvest circuit 60 that is electrically coupled to receive electrical energy generated by the piezoelectric element 18. The energy harvest circuit 60 is configured to convert the electrical energy from the piezoelectric element 18 (e.g., alternating current) into a corresponding voltage that can be supplied to one or more storage devices 62. For example, the energy harvest circuit 60 includes an AC-DC power converter (e.g., a rectifier and buck boost converter) configured to supply DC voltage that is stored in the one or more energy storage devices 62. The energy storage device 62 thus provides power to the system 10.

For example, the system 10 includes a power management circuit 64 configured to control the managed consumption of electrical energy stored in the device 62. For example, the power management circuit 64 is implemented as an integrated circuit chip, such as an application specific integrated circuit (ASIC) configured to perform power management functions as well as control other functions of the system 10.

In the example of FIG. 1, the power management circuit 64 includes a wireless communication unit 66 that is configured to send a communication signal based on a sensor signal. The power management circuit 64 also includes one or more sensors 68 configured to detect a sensor condition and provide a corresponding sensor signal, which can be converted to a digital value. For example, the one or more sensors 68 may include a temperature sensor, pressure sensor, humidity sensor, light sensor, occupancy sensor or sound sensor. Other sensors may also be utilized in other examples, such may vary according to application requirements. The power management circuit 64 can control the wireless communication unit 66 to send a communication signal based on the sensor signal. For example, the sensor signal can be sampled over time and stored in memory (not shown) as digital sensor data. The wireless communication unit 66 can provide an RF signal to a corresponding antenna to wirelessly transmit the sensor data through a wireless network to a remote location, which may be connected in the wireless network, directly or indirectly.

As one example, the sensor 68 may include an acceleration sensor (e.g. accelerometer) configured to measure acceleration data, delivers the data to the wireless communication unit through a bus for wireless transmission. For accurate measurement, traditional vibration sensor has a high sample rate to collect many acceleration data and then do the computation on the device 14. However, a wireless transmission rate of about 1 data per 2 minutes may not provide meaningful data because the acceleration reading could be the positive peak or negative peak or any place in the sine wave. In an example, the sensor 68 may include a multi-level buffer. For the example of a sample rate of about 400 Hz, the sensor 68 may be configured to collect 8×32 data points in the buffer. The system can be configured to perform a root mean square (RMS) calculation to get the sensor RMS reading. The RMS reading can be stored in memory and be transmitted wirelessly through the wireless communication unit 66.

As a further example, the RMS equation is shown below, which may be implemented on data acquired in variety of approaches. A first example approach is to take 32 acceleration data 8 times in a row so there are 256 acceleration data in total and then do RMS. A second way is to compute RMS on the 32 acceleration data and repeat this eight times and find the max value among these g'RMS values. A third method calculates RMS on the 32 acceleration data and repeat for eight times, then find the average value among these g'RMS values.

$$x_{rms} = \sqrt{\frac{1}{n}(x_1^2 + x_2^2 + \ldots + x_n^2)}$$

By way of example, the wireless communication unit 66 includes RF circuitry configured to wirelessly transmit sensor data to a remote device. The wireless communication unit 66 may transmit the sensor data periodically or intermittently. In some examples, the transmission may be triggered in response to detecting a given event (e.g., by the sensor). As a further example, the wireless communication unit 66 may be configured to implement a wireless protocol, such as ZigBee, Z-wave, LoRaWAN, NarrowBand IOT, LTE-M and IEEE 802.15.4 to name a few. The wireless protocol may be implemented to reduce the power consumption.

In some examples, the wireless communication unit 66 may be configured as a transceiver to provide bi-directional communication in the wireless network, such as to enable programming operation and/or control of the power management circuit 64, including the sensor 68 and/or the wireless communication unit 66. The time interval for data communications can be programmed to vary as a function of the energy storage device, which may be set to default parameter or be user-programmable. For the example, where the sensor 68 is a temperature sensor, a periodic transmission rate of approximately 15 minutes per data transmission may be used to send the on-chip temperature data through the network. Other transmission intervals may be used in other examples.

In some examples, the power management circuit 64 also includes a cold start module 70 that is configured to supply power to the wireless communication unit and to disable shut down of a power management circuit during a startup phase of the system 10. This is to allow sufficient time for the wireless communication unit 66 to join a corresponding wireless network, such as disclosed herein. In this way, the system 10 can provide a self-powering sensor system 10 is capable of operating from cold start and connecting with a wireless network without shutting down prematurely. For example, when the supply voltage value is low (e.g., it is difficult to drive the wireless sensor node), the cold start module 70 will shut down (deactivate) a regulator of the power management circuit 64 that supplies the sensor and wireless communication unit. This allows the energy harvester apparatus 12 to charge the storage device 62. When enough energy is harvested (e.g., after a sufficient time interval), the cold start module 70 will enable (e.g., activate) the regulator to supply power to the wireless communication unit 66. During start up, the wireless communication unit 66 can implement a joining process to join the wireless network (e.g., including scanning channels, listening for beacons, and implement security, if any, etc.) and register the system to operate as a wireless sensor node in the network. Further examples of cold start circuitry are disclosed herein with respect to FIGS. 8 and 9.

FIGS. 2-3 depict another example of an energy harvesting apparatus 80 that includes a housing 82 (e.g., corresponding to housing 40). The housing 82 is demonstrated as rectangular prism although other configurations of houses may be used in other examples. The housing includes or contains a plate support portion 84 that is configured to support a circumferential edge of the piezoelectric plate 86, such that a central piezoelectric active portion 88 of the plate 86 can deform in a direction that is orthogonal to a surface of the plate. For example, a retaining shoulder 92 of the support 84 engage a circumferential edge of the plate 86 to support the central active portion 88 above the recess 90. The plate 86 may be fixed to the support 84.

An elongated cylindrical body (e.g., corresponding to the body 30) 98 can include a central aperture or slot to receive a protruding member 96 that extends longitudinally from an opposite side of the housing 82. The protruding member 96 thus can be received within the central aperture body 98 to constrain the direction of movement of the body 98 along an axis that is substantially orthogonal to the plate surface. The apparatus 80 also includes associated circuitry 100 that is contained within the housing 82 such as can be attached fixedly or flexibly to a wall of the housing. The circuitry 100 can include the circuitry 14 of FIG. 1.

Figure 4:
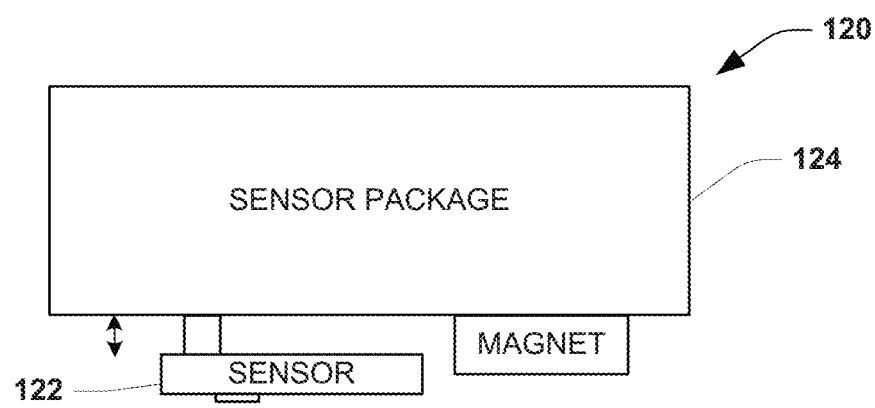
FIG. 4 depicts an example of a self-powering wireless sensor.

FIG. 4 depicts a schematic illustration of a self-powering sensing system 120. In the example of FIG. 4, a sensor 122 is demonstrated as being external the sensor package, such as attached by a spring-loaded connector. It is understood that the location and construction of the sensor 122 can vary depending upon the condition being sensed. Such a flexible connector allows the temperature sensor (e.g., breakout board) to move up and down freely. In the example of FIG. 4, the external sensor 122 is demonstrated as being a temperature sensor. The system 120 also includes a magnet 124 that can be utilized to attach a package housing of the system 120 to a corresponding metal structure. Thus, while the package is attached to the equipment, the magnet will hold the sensor package to the equipment surface, and the spring loaded pin will make the temperature sensor contact the equipment surface firmly. The direct contact between the temperature sensor and equipment surface make the temperature reading very accurate to reflect the equipment operating condition. Additionally, the magnet may be configured so that, when attached to the object, the long axis of the body mass is aligned parallel to the direction of vibration to facilitate energy harvesting.

Figure 5:
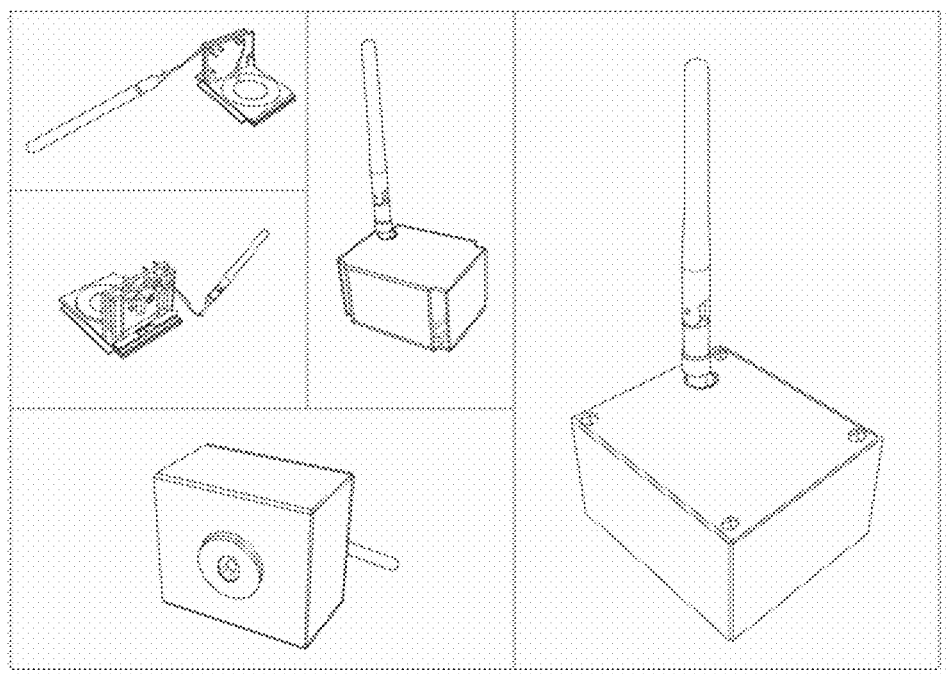
FIG. 5 depicts examples from different views for a self-powering wireless sensor system.

FIG. 5 depicts an example of another self-powering sensor device such that can be implemented according to the examples of FIGS. 1-3. In the example of FIG. 5, an antenna extends outwardly from a surface of the package housing, for example from a side that is opposite the surface to which a magnet is attached. The housing may be formed of a metal or other rigid material to facilitate transfer vibrational energy from an object to which the device is attached to the energy harvesting apparatus (e.g., apparatus 12, 80) that is inside the housing. The material use for the housing may be selected according to the environment where the device is intended to be deployed.

Figure 6:
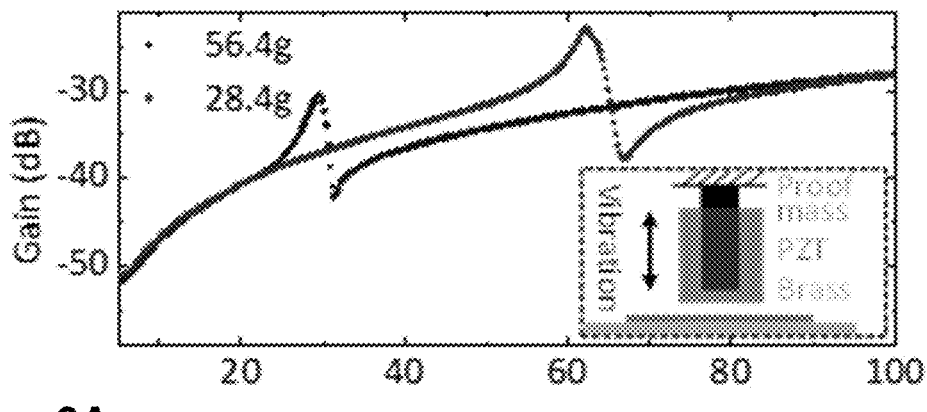
FIG. 6 includes FIGS. 6A, 6B and 6C to depict respective graphs of different operating parameters for a self-powering sensor system.
Figure 6:
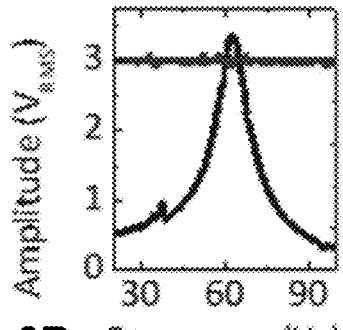
Figure 6:
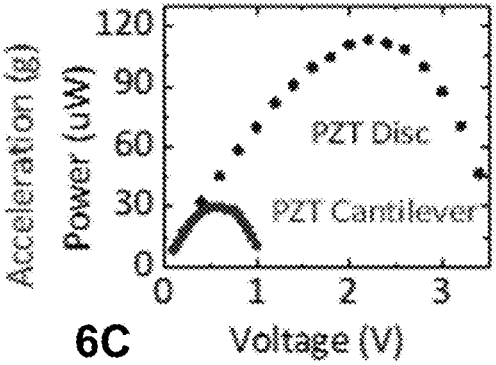

FIG. 6 depicts plots demonstrating operation of a disc-structured PZE harvester such as disclosed herein. For example, FIG. 6(a) demonstrates frequency responses with different bodies (e.g., different weight proof masses). As mentioned, the weight of proof mass can be adjusted to change resonance frequency. For example, the plot of FIG. 6(a) shows gain versus measurement for two different example proof masses (e.g., 28.4 g and 56.4 g) showing the resonance frequency being adjusted from about 30 Hz to about 60 Hz, which cover most of the equipment in the power plant. Additionally, changing proof mass is simple since, in some examples, the proof mass is not attached to the disc.

FIG. 6(b) demonstrates an example of PZE harvester output voltage as a function of frequency for an example disc-shaped harvester (e.g., as shown in FIGS. 1-3) for a 28.4 g proof mass under 0.05 g excitation acceleration. FIG. 6(c) is a plot of electrical power versus voltage demonstrating a comparison of output power performance between a disc-structured PZE harvester (e.g., FIGS. 1-3) and a cantilever-shaped PZE harvester under 0.05 g acceleration. FIG. 6(c) shows the disc-structure PZE harvester exhibits a boost in output power over the cantilever-shaped PZE harvester.

Figure 7:
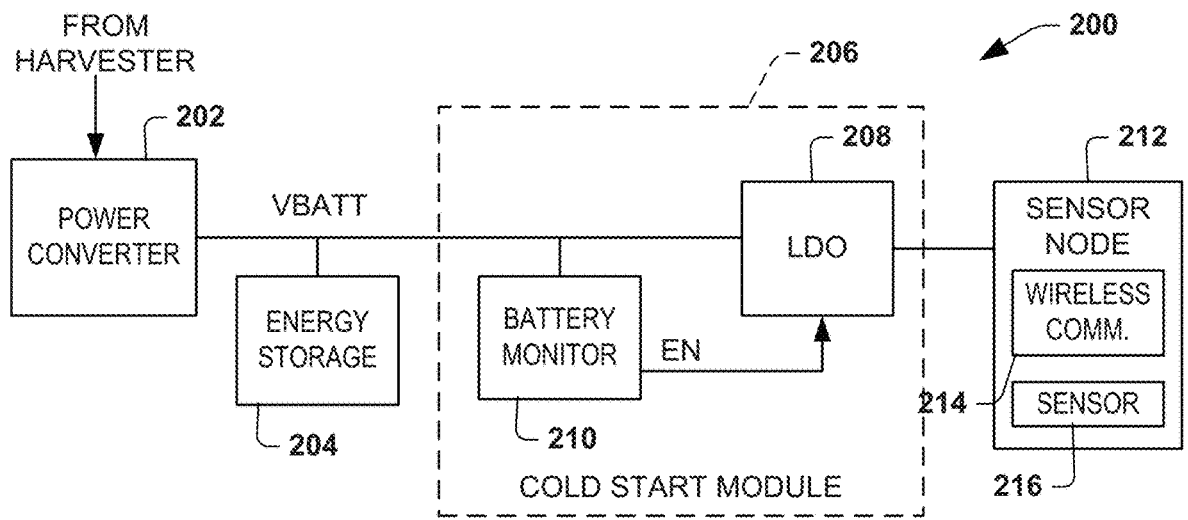
FIG. 7 is a block diagram of a power circuit for an energy harvesting apparatus.

FIG. 7 is a block diagram of a power circuit for an energy harvesting apparatus. The circuit 200 includes a power converter 202 that is coupled to receive an electrical signal (e.g., and AC signal) from an output of the energy harvesting apparatus. For example, the power converter 202 includes a rectifier to convert the AC electrical signal from the energy harvesting apparatus to a DC signal. The power converter 202 may also include a boost convert to boost the rectified voltage signal to a desired level for charging an energy storage device 204 to provide a supply voltage, corresponding to VBATT. The battery voltage VBATT is supplied to a cold start module 206. The energy storage device 204 may be a supercapacitor or rechargeable battery (e.g., polymer Li-ion rechargeable battery), for example.

The cold start module 206 is configured to supply power to a sensor node 212 based on the voltage VBATT. The sensor node 212 includes a wireless communication unit (e.g., unit 66) 214 and a sensor (e.g., sensor 68) 216. During a start-up phase of the system, the cold start module 206 operates to disable shutdown of the power circuit 200 (e.g., by forcing it to remain enabled) for a sufficient time interval so that the sensor node 212 receives power. The time interval can be set to allow the wireless communications unit 214 to activate and join a wireless network, such as disclosed herein.

For example, the cold start module includes a regulator, such as a low dropout (LDO) regulator 208 and a battery monitor 210. The LDO 208 is configured to supply a stable DC voltage for electronics of the sensor node 212 to operate efficiently. The battery monitor 210 is configured to monitor the voltage level of VBATT, which is based on the energy harvested from the PZE harvester, and to control the operating state of the LDO. In response to the battery monitor detecting that enough energy is harvested (e.g., based on VBATT exceeding a given threshold voltage), the battery monitor 210 will activate (enable) the LDO to provide power to the sensor node. When the voltage value is low (e.g., detected by monitor to be below a threshold voltage), such as when it is hard to drive the sensor node, the battery monitor 210 is configured to deactivate the LDO to stop supplying the output voltage to sensor node. This allows the energy harvester to just charge the storage element without consuming power by the sensor node. However, during an initial time interval after having met the given threshold and activating the LDO, the battery monitor 210 is configured to disable the shutdown of the LDO temporarily for a duration. As mentioned, this duration allows the wireless communications unit 214 to join a wireless network. After such duration, the low-voltage shutdown function of the battery monitor can be enabled.

Figure 8:
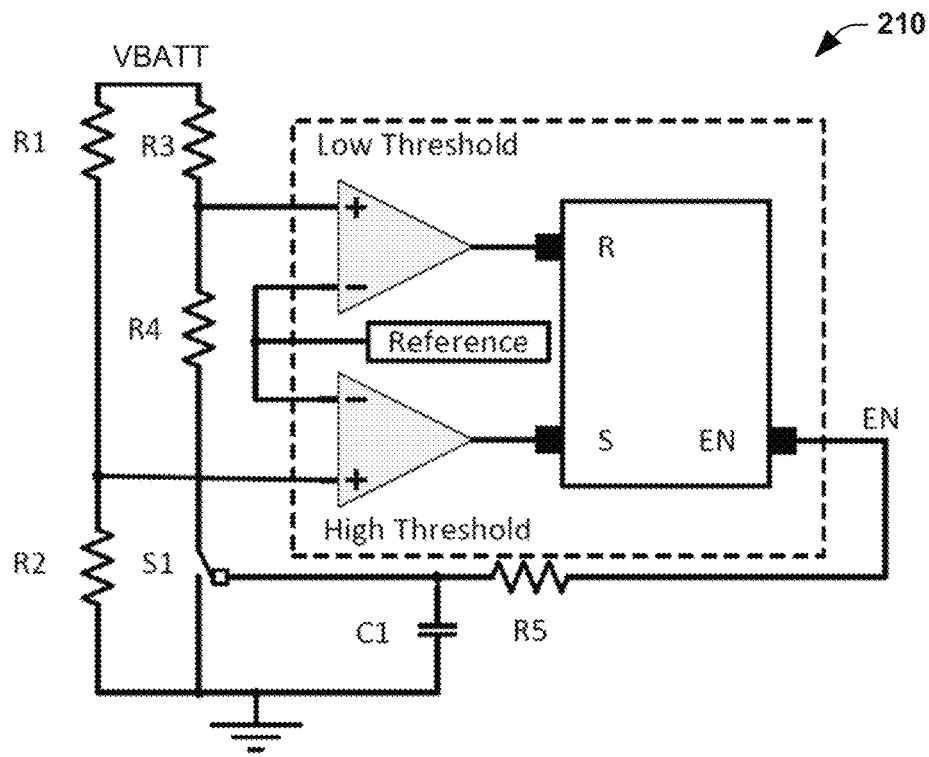
FIG. 8 depicts an example of a battery monitor for controlling cold start of a self-powering wireless apparatus.

FIG. 8 depicts an example of a battery monitor for controlling cold start of a self-powering wireless apparatus. The battery monitor includes a resistor network of resistors R1, R2, R3, R4 connected between VBATT and ground. Nodes between resistors are tapped to provide respective low and high thresholds, which are provided to non-inverting inputs of comparators. A reference voltage is applied to the inverting inputs of the comparators. Each of the comparators provides a corresponding output to respective inputs of an output circuit (e.g., to R S inputs of a flip flop). The output circuit provides an enable (EN) signal at an output, which is connected to activate or deactivate the regulator (e.g., LDO 208). A timer circuit, such as an RC network (R5 and C1), is coupled between the output of the flip flop and ground. A node between R5 and C1 is also coupled to control a switch S1, which is coupled between R4 and ground. The timer circuit thus control activation of the switch when the enable signal changes from high to low. For example, the RC network delays activation of the switch at such transition for a time interval corresponding to the RC time constant. Thus, the time constant can be set to provide a time interval sufficient to allow the wireless communications unit to receive electrical power join a wireless network during the start-up phase. After the switch is activated, the low voltage detection is enabled, such that if VBATT falls below the low threshold, the output circuit resets to provide a low output to disable the LDO.

Figure 9:
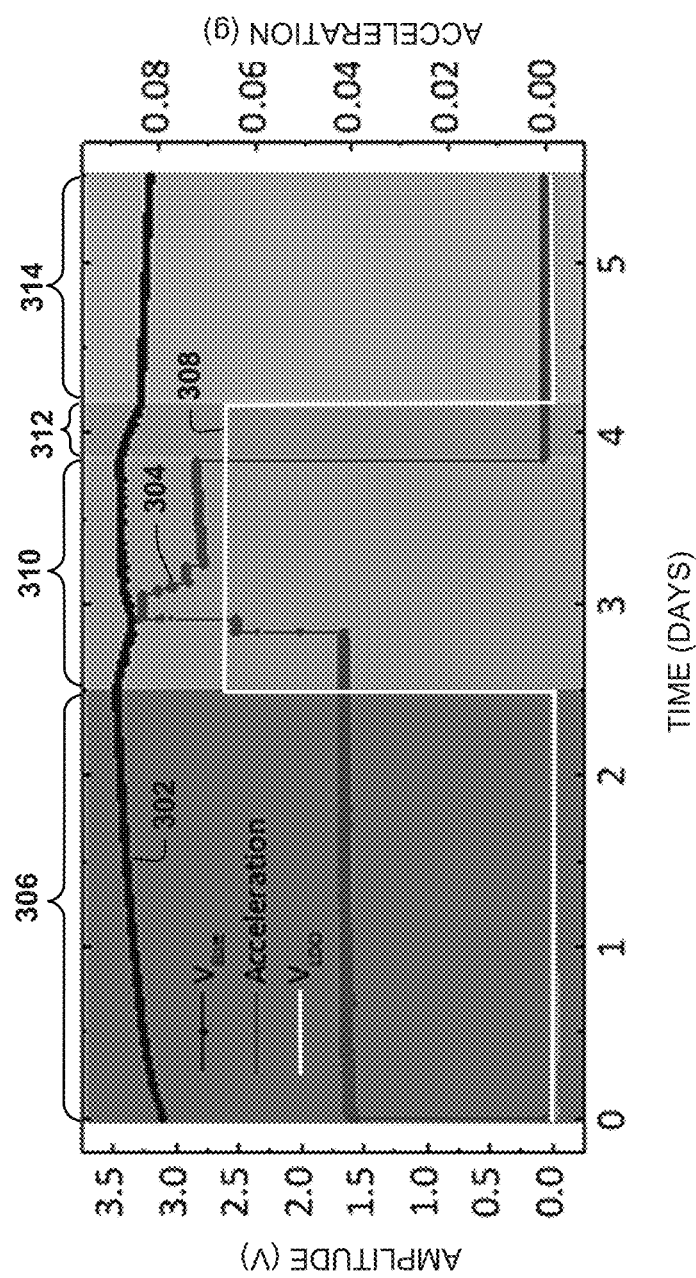
FIG. 9 is a graph of voltage versus time and acceleration versus time for an example energy harvesting apparatus.

FIG. 9 is a graph 300 of voltage versus time and acceleration versus time for an example energy harvesting apparatus implementing the cold start function. VBATT is the voltage across the storage element, such as having an initial voltage is around 3 V. As mentioned, the battery monitor (e.g., monitor 210) is configured to turn on the wireless sensor by controlling the regulator (e.g., LDO 208) when VBATT exceeds a high voltage threshold (e.g., VBATT>3.45 V) and shut the wireless sensor down when VBATT is less than a low threshold (e.g., VBATT<3.1 V). The line 304 represents the output from an accelerometer to monitor the vibration condition of the vibration generator. When the vibration generator begins to vibrate (zone 306), the PZE harvester will charge the storage element and therefore VBATT 302 is increasing. When the VBATT exceeds the high threshold (e.g., 3.45 V), the LDO begins to supply the wireless sensor node (e.g., node 212) with a stable voltage of about 2.6 V, demonstrated at 308. In an intermediate zone 310, the vibration amplitude of the vibration generator is adjusted, such that a 0.07 g vibration amplitude is needed for this wireless sensor node to operate continuously. For example, it is expected that most of the equipment in the power plant can provide 0.05 to 0.15 g vibration. The zone 312 shows an example of when the vibration generator is turned off (e.g., no vibration). Thus in zone 312, while no (or little) energy is being harvested, the wireless sensor node consistently drains energy from the storage element and eventually the circuit will turn off the LDO, which shuts down the wireless sensor (zone 314). The cold start function implemented by the battery monitor improves operation for the wireless sensor node because the vibration from equipment may vary and even stop when the power plant is under a scheduled outage. Accordingly, a wireless self-powering node, as disclosed herein, is able to cold start itself when the vibration is reassumed.

What have been described above are examples. It is, of course, not possible to describe every conceivable combination of components or method, as many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An energy harvesting system, comprising:
   a plate support;
   a piezoelectric element, which is configured as a plate, supported at its periphery by the plate support to enable a central portion of the piezoelectric element to move along an axis that is orthogonal to a contact surface of the plate; and
   a body support including an elongated protrusion opposing the plate support and extending parallel to the axis, the body support being fixed with respect to the plate support; and
   a body having a mass configured to move in a direction that is substantially parallel to the axis and apply force to deform the contact surface of the plate, such that electrical energy is generated by the piezoelectric element based on the applied force, the body including a central slot extending from a proximal end and into the body, the slot configured to slidably receive the protrusion therein so as to constrain the movement of the body in a direction that is substantially parallel to the axis.

2. The system of claim 1, wherein the piezoelectric element includes a disc-shaped plate that includes the contact surface and an opposing side surface,
   wherein the plate support has a support surface that engages the opposing side surface of the plate along its periphery, the plate support including a recess extending from the support surface to provide a void that is spaced apart from the support surface, a portion of the support surface surrounding the recess, the recess having a central axis that is aligned substantially coaxially and parallel with the axis of the plate.

3. The system of claim 2, wherein the piezoelectric element includes a layer of a piezoelectric material mounted on a layer of a substrate material.

4. The system of claim 3, wherein piezoelectric material includes lead zirconate titanate.

5. The system of claim 1, further comprising a housing that includes the plate support, the body support, the piezoelectric element and the body, the body support and plate support being fixed within the housing.

6. The system of claim 5, wherein the elongated protrusion extends from a side of the housing opposite the plate support.

7. The system of claim 1, wherein the body is configured to be interchangeable with a plurality of interchangeable bodies having different masses, each configured to provide set a different resonance frequency.

8. An energy harvesting system, comprising:
   a plate support;
   a piezoelectric element configured as a plate supported at its periphery by the plate support to enable a central portion of the piezoelectric element to move along an axis that is orthogonal to a contact surface of the plate;
   a body having a mass configured to move in a direction that is substantially parallel to the axis and apply force to deform the contact surface of the plate, such that electrical energy is generated by the piezoelectric element based on the applied force, wherein the body is configured to be interchangeable with a plurality of interchangeable bodies having different masses, each configured to set a different resonance frequency;
   a body support configured to constrain movement of the body in the direction that is substantially parallel to the axis, the body support being fixed with respect to the plate support; and
   a housing configured to provide an enclosure that include means to access an interior of the housing to access and replace the mass, wherein the body support, the piezoelectric element, the body, the body support and plate support are within the housing.

9. The system of claim 8, wherein the mass of the body is configured to set a resonance frequency of the system.

10. The system of claim 9, wherein the mass is configured to provide a resonance frequency that is less than 120 Hz.

11. The system of claim 9, wherein the mass is configured to provide a resonance frequency that ranges from about 30 Hz to about 60 Hz.

12. An energy harvesting system, comprising:
    a support;
    a piezoelectric element configured as a plate supported at its periphery by the support to enable a central portion of the piezoelectric element to move along an axis that is orthogonal to a contact surface of the plate; and
    a body having a mass configured to move in a direction that is substantially parallel to the axis of the plate and apply force to deform the contact surface of the plate, such that electrical energy is generated by the piezoelectric element based on the applied force;
    an energy harvest circuit configured to convert the electrical energy to a corresponding voltage; and
    an energy storage device configured to store electrical energy based on the corresponding voltage;
    a cold start module configured to supply power to the wireless communications unit and to disable shutdown of a power management circuit during a start-up phase of the system so as to provide sufficient time to allow the wireless communications unit to join a wireless network.

13. The system of claim 12, further comprising:
    a sensor configured to detect a sensed condition and provide a sensor signal; and and a wireless communications unit configured to send a communications signal that includes data based on the sensor signal.

14. The system of claim 12 further comprising a battery monitor configured to monitor the supply voltage, the battery monitor comprising:
  a comparator configured to compare a reference voltage with the supply voltage, which represents a low voltage threshold, and to provide a comparator output signal based on a result of the comparison;
  an output circuit configured to provide an output signal, corresponding to an enable or disable signal, based on the result of the comparison;
  a switch device coupled to an input of the comparator to control the low voltage threshold based on a state of the switch;
  a timer circuit configured to control the switch based on the output of the output circuit, the timer circuit to activate the switch and thereby enable low voltage detection after a time interval in response to start-up of the power circuit during the start-up phase, the time interval providing sufficient time to allow the wireless communications unit to receive electrical power join a wireless network during the start-up phase.

15. The system of claim 12, further comprising a sensor configured to sense a condition and provide sensor data indicative of the sensed condition, the wireless communications unit being configured to wirelessly transmit the sensor data.

16. The system of claim 15, wherein the sensor comprises a temperature sensor configured to provide temperate data, the radio frequency module to receive the sensor data and send the sensor data wirelessly.

* * * * *